United States Patent [19]

Chang

[11] Patent Number: 5,736,764
[45] Date of Patent: Apr. 7, 1998

[54] PMOS FLASH EEPROM CELL WITH SINGLE POLY

[75] Inventor: Shang-De Ted Chang, Fremont, Calif.

[73] Assignee: Programmable Microelectronics Corporation, San Jose, Calif.

[21] Appl. No.: 560,249

[22] Filed: Nov. 21, 1995

[51] Int. Cl.$^6$ .................................................. H01L 29/788
[52] U.S. Cl. ........................................ 257/318; 257/321
[58] Field of Search ....................................... 257/318, 321

[56] References Cited

U.S. PATENT DOCUMENTS

| | | |
|---|---|---|
| 3,919,711 | 11/1975 | Chow . |
| 4,019,197 | 4/1977 | Lohstroh et al. . |
| 4,035,820 | 7/1977 | Matzen . |
| 4,288,863 | 9/1981 | Adam . |
| 4,404,577 | 9/1983 | Cranford, Jr. et al. . |
| 4,425,631 | 1/1984 | Adam . |
| 4,435,790 | 3/1984 | Tickle et al. ............................ 365/218 |
| 4,532,535 | 7/1985 | Gerber et al. . |
| 4,924,278 | 5/1990 | Logie . |
| 4,970,565 | 11/1990 | Wu et al. . |
| 5,282,161 | 1/1994 | Villa . |
| 5,291,047 | 3/1994 | Iwasa . |
| 5,404,037 | 4/1995 | Manley ................................ 257/321 |
| 5,504,706 | 4/1996 | D'Arrigo et al. .................. 365/185.18 |
| 5,576,568 | 11/1996 | Kowshik ............................. 257/318 |

OTHER PUBLICATIONS

Masanori Kikuchi, Shuichi Ohya and Machio Yamagishi, *A New Technique to Minimize the EPROM Cell*, IC Division, Nippon Electric Company, Ltd., 1753, Shimonumabe, Kawasaki, Japan, pp. 181–182.

Dov Frohman-Bentchkowsky, Intel Corporation, Santa Clara, California, *FAOS—A New Semiconductor Charge Storage Device*, Solid State Electronics 1974, vol. 17 pp. 517–529.

Constantine A. Neugebauer and James F. Burgess, General Electric Corporation, *Session XV: Programmable Read-Only Memories*, Feb. 18, 1977, pp. 184 and 185.

S. Baba, A. Kita and J. Ueda, *Mechanism of Hot Carrier Induced Degradation in MOSFET's*, VLSI R&D Center, Oki Electric Industry Co., Ltd., 1986, pp. 734–737.

Primary Examiner—Ngân V. Ngô
Attorney, Agent, or Firm—Skjerven, Morrill, MacPherson, Franklin & Friel

[57] ABSTRACT

A P-channel single-poly EPROM cell has P+ source and P+ drain regions, and a channel extending therebetween, formed in an N-type well. A thin layer of tunnel oxide is provided over the channel and, in some embodiments, over significant portions of P+ source and P+ drain regions. A poly-silicon floating gate overlies the tunnel oxide. A P diffusion region is formed in a portion of the N-well underlying the floating gate and is thereby capacitively coupled to the floating gate. In this manner, the P diffusion region serves as a control gate for the memory cell. Programming is accomplished by coupling a sufficient voltage to the floating gate via the control gate while biasing the source and drain regions to cause the hot injection of electrons from the N-well/drain junction to the floating gate, while erasing is realized by biasing the floating gate, N-well, source and drain regions appropriately so as cause the tunneling of electrons from the floating gate to the N-well, the source, and the drain. In another embodiment, an N-type diffusion region is formed within the P diffusion region and serves as the control gate.

10 Claims, 15 Drawing Sheets

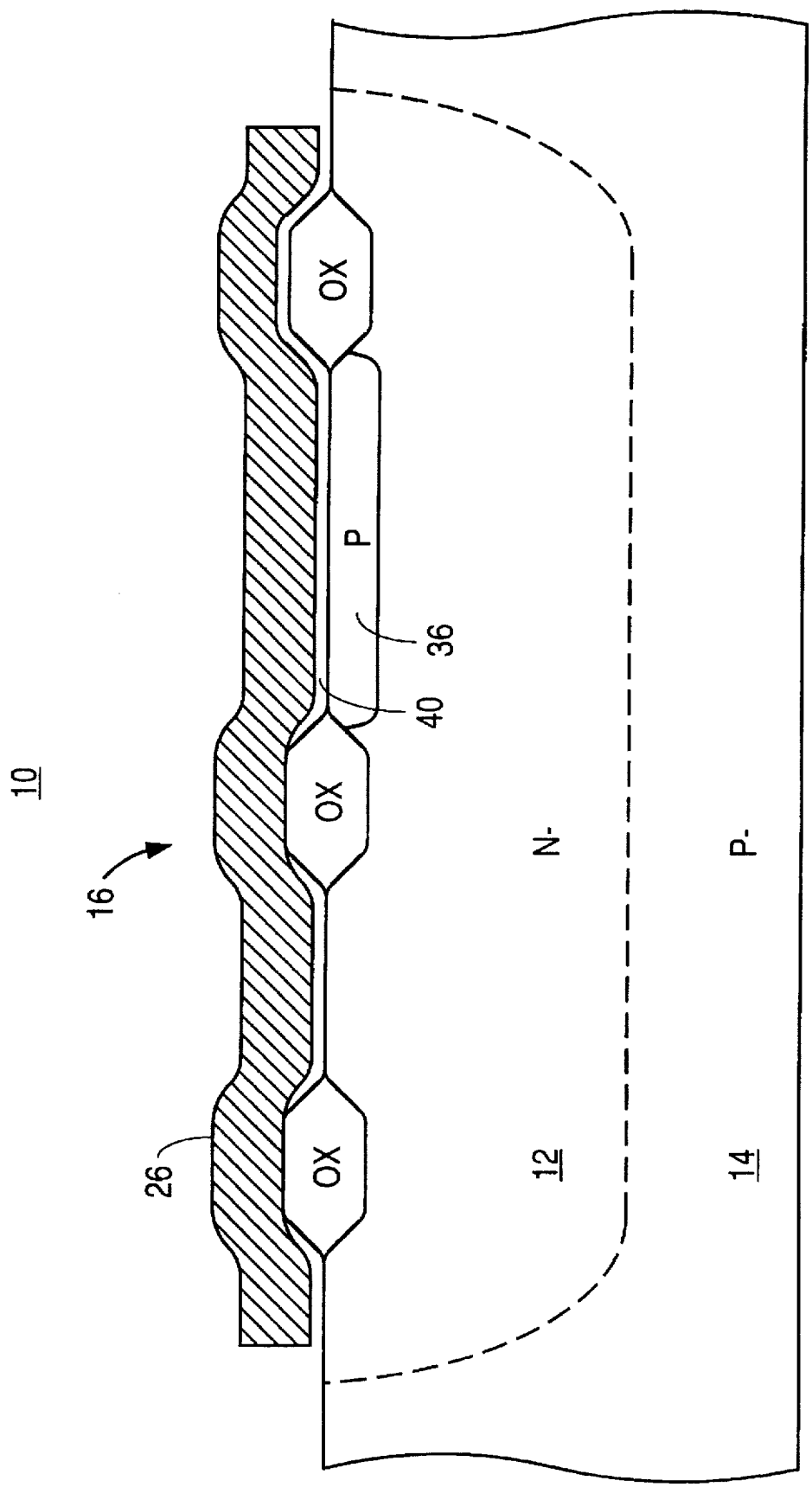

PMOS FLASH EEPROM CELL WITH SINGLE POLY

CROSS REFERENCE TO RELATED APPLICATIONS

This application is related to the U.S. patent application Ser. No. 08/557,589 entitled "A PMOS Memory Cell with Hot Electron Injection Programming and Tunnelling Erasing", U.S. patent application Ser. No. 08/557,442 entitled "Non-volatile Electrically Erasable Memory with PMOS Transistor NAND Gate Structure", and U.S. patent application Ser. No. 08/557,514 entitled "A PMOS Flash Memory Cell Capable of Multi-level Threshold Voltage Storage", all filed on Nov. 14, 1995.

BACKGROUND

1. Field of the Invention

The present invention relates generally to memory cells and specifically to a P-channel single poly memory cell.

2. Description of Related Art

It is desirable, when embedding memory cells into a semiconductor logic circuit fabricated using a standard logic process, to do so without changing the single-poly process typically used in the fabrication of the logic circuitry. This desire has resulted in a single-poly EEPROM cell having N+ source and N+ drain regions formed in a P-substrate and a polysilicon gate overlying a channel region extending between the source and the drain. An N diffusion region formed in the P-substrate serves as the control gate and is capacitively coupled to the floating gate via a thin oxide layer. The oxide layer has a tunnel window opened in a portion thereof near the N+ drain to facilitate electron tunneling. Since the control gate and floating gate of this single-poly EEPROM cell form a capacitor in a manner similar to that of the more traditional stacked-gate, or double-poly, EEPROM cells, the single-poly EEPROM cell is programmed, erased, and read in a manner similar to that of the double-poly EEPROM cell. That is, programming is accomplished by electron tunneling from the floating gate to the substrate, while erasing is realized by electron tunneling from the substrate/drain region to the floating gate.

The above-described N-channel single-poly EEPROM cell is disadvantageous since it requires programming and erasing voltages of 20 V. These high programming and erase voltages limit the extent to which the size of such cells may be reduced. Accordingly, it would be desirable to form a single poly EEPROM cell which requires lower programming voltages.

SUMMARY

A single-poly memory cell is disclosed herein which overcomes problems in the art described above. In accordance with the present invention, a P-channel single-poly flash EEPROM cell has P+ source and P+ drain regions, and a channel extending therebetween, formed in an N-type well. A thin layer of tunnel oxide is provided over the channel and, in some embodiments, over significant portions of P+ source and P+ drain regions. A poly-silicon floating gate overlies the tunnel oxide. A P diffusion region is formed in a portion of the N-well underlying the floating gate and is thereby capacitively coupled to the floating gate. In this manner, the P diffusion region serves as a control gate for the memory cell.

Programming is accomplished by coupling a sufficient voltage to the floating gate via the control gate while biasing the source and drain regions to cause the injection of hot electrons from the N-well/drain junction to the floating gate, while erasing is realized by biasing the floating gate, N-well, source and drain regions appropriately so as cause the tunneling of electrons from the floating gate to the N-well, the source, and the drain.

In another embodiment, an N-type diffusion region is formed within the above-described P-type diffusion region, where the N-type diffusion region serves as the control gate. In this manner, voltages may be applied to the control gate in excess of those applied to the N-well without creating a current path from the control gate to the N-well.

BRIEF DESCRIPTION OF THE DRAWINGS

FIG. 2 is a cross-sectional view of the cell of FIG. 1 taken along line A—A;

DETAILED DESCRIPTION

Figure 1:
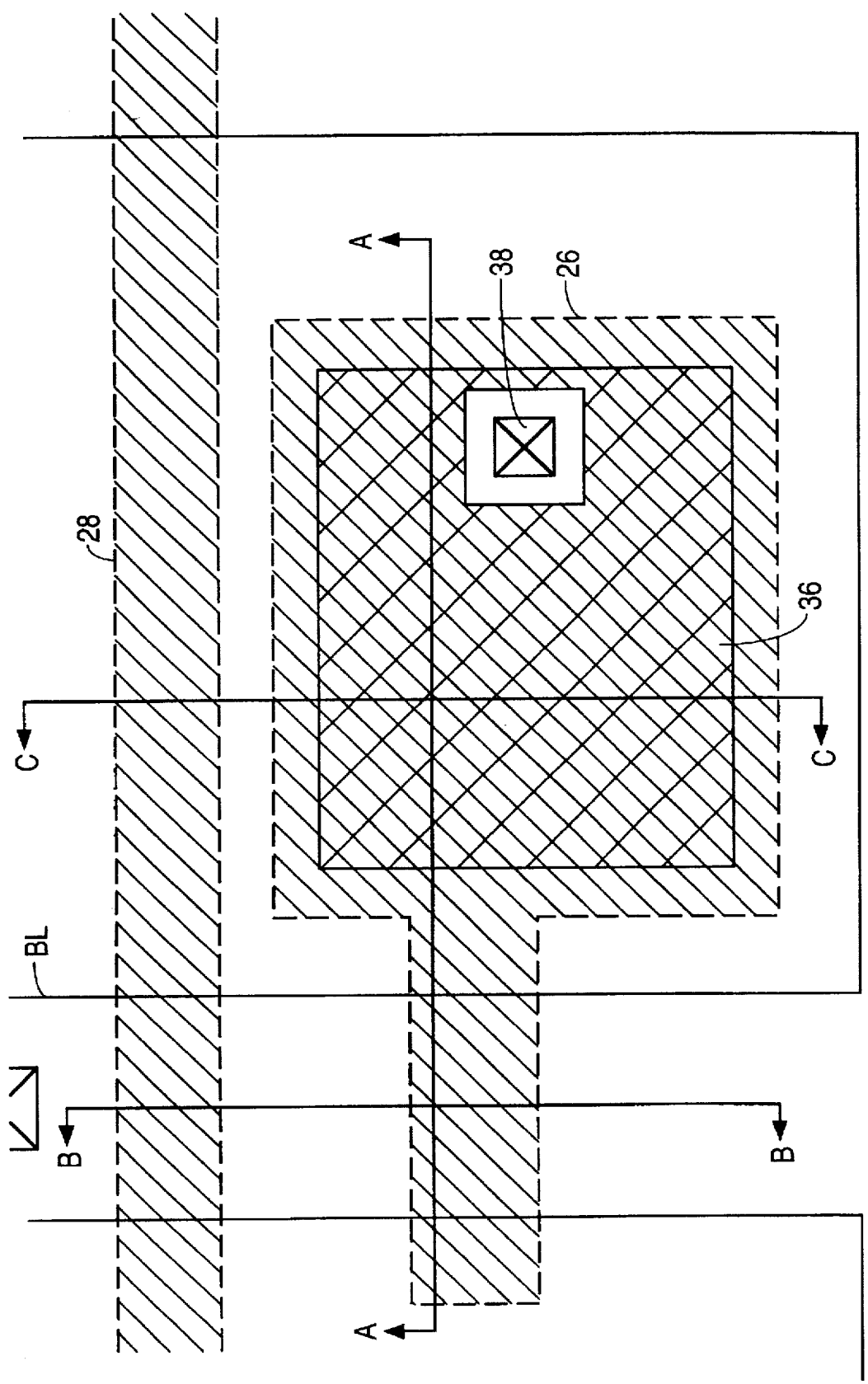
FIG. 1 is a top view of a PMOS single-poly flash cell in accordance with the present invention.

Referring now to FIGS. 1-4, a P-channel single poly flash cell 10 (FIG. 3A) is formed in an N-well 12 provided within a P-substrate 14 and includes a P-channel storage transistor 16 and a P-channel select transistor 18. P+ diffusion region 20 serves as the source for storage transistor 16, P+ diffusion 22 serves as both the drain for storage transistor 16 and the source for select transistor 18, and P+ diffusion region 24, which is coupled to a bit line BL, serves as the drain for select transistor 18. Poly-silicon gates 26 and 28 serve as the floating gate and select gate, respectively, of flash cell 10. Application of a bias voltage to a control gate 36 (FIGS. 1 and 2) enhances a channel 30 (FIG. 3A) extending between source 20 and drain 22 of storage transistor 16, and the application of a bias voltage to select gate 28 enhances a channel 32 extending between source 22 and drain 24 of select transistor 18.

A P-type buried diffusion layer 36 (FIG. 2) serves as the control gate of flash cell 10. A contact 38 (FIG. 1) is opened in floating gate 26 and in a layer of oxide 40 interposed between floating gate 26 and control gate 36 to enable electrical contact with buried control gate 36. Tunnel oxide layer 34, (FIG. 3A) which is preferably 80–130 521 thick, may extend over channel 30 and substantial portions of source 20 and drain 22. A layer of oxide 40 (FIG. 2) approximately 80–350 Å thick is provided between floating gate 26 and P diffusion region 36. It is to be noted that unlike conventional N-channel single-poly EEPROM cells, it is not necessary to open a tunnel window in tunnel oxide layer 34.

Together, floating gate 26 and control gate 36 form an MOS capacitor in the same manner as that of conventional N-channel EEPROM cells. When floating gate 26 is uncharged, cell 10 has a threshold voltage $V_t$ of approximately –4.5 V.

The operation of cell 10 is as follows. To program cell 10, bit line BL and select gate 28 are grounded (FIG. 3A) while source 20 and N-well 12 are held at approximately 8 V. Approximately 8.5 V is applied to control gate 36 (FIG. 2). Positively charged holes from P+ source 20 are attracted to the less positive voltage on P+ drain 22 and accelerate through channel region 30 towards P+ drain 22. These holes collide with electrons in the depletion layer proximate drain 22. High energy electrons generated from the resultant impact ionization are attracted by the positive voltage of floating gate 26 (approximately 7.5 V is capacitively coupled thereto via control gate 36, source 20, channel region 30, and drain 22) and are thus injected from the drain depletion layer into floating gate 26. The resultant negative charge on floating gate 26 depletes channel region 30 and forces cell 10 into deep depletion. In the preferred embodiment, storage transistor 16 has, in its programmed state, a $V_t$ equal to approximately 1 V. In the preferred embodiment, a current limiting device (not shown) is coupled to bit line BL to prevent programming currents from exceeding approximately 100 µA, thereby limiting power consumption during programming.

Figure 3A:
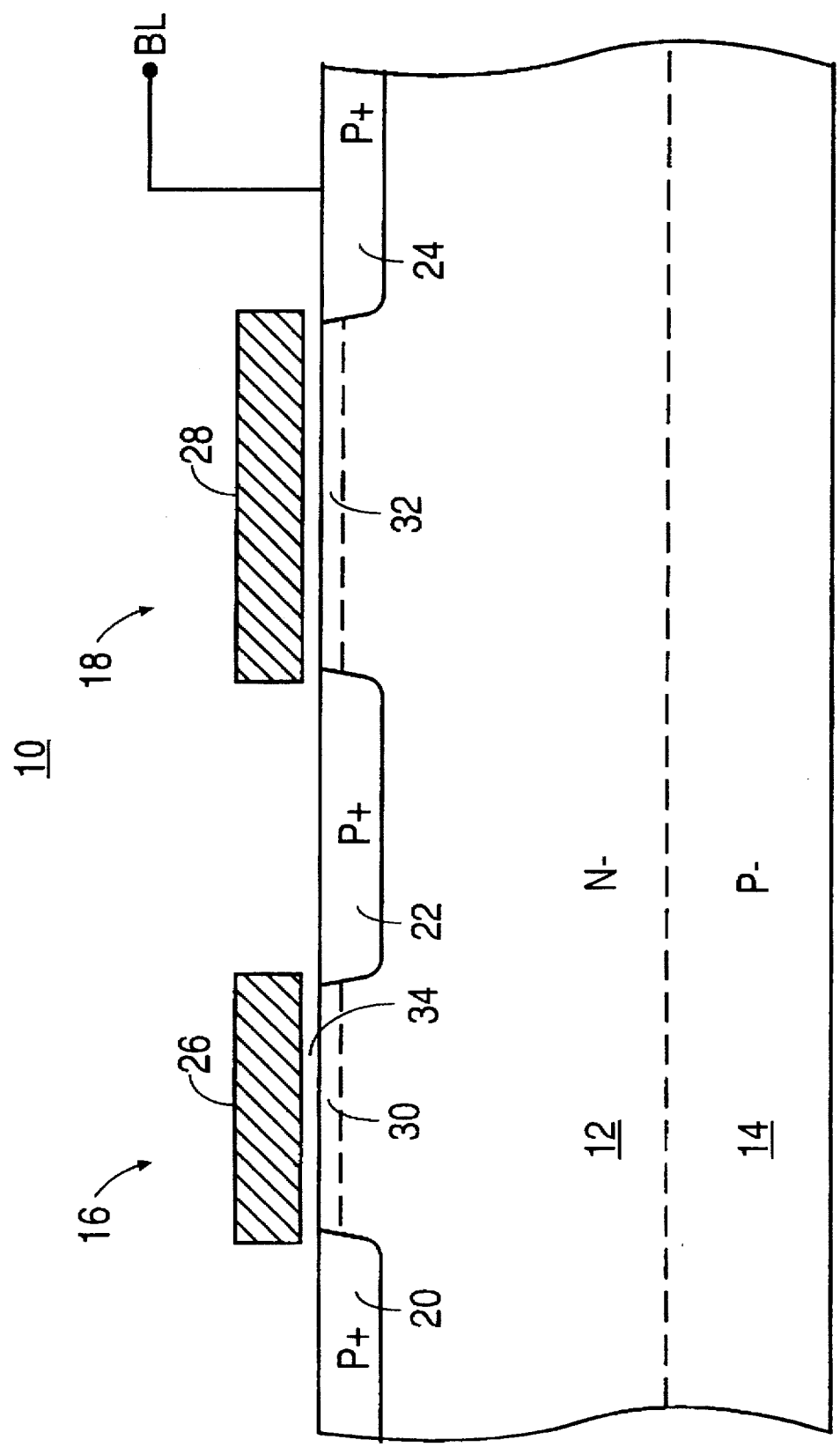
FIGS. 3A and 3B are cross-sectional views of the cell of FIG. 1 taken along line B—B.

Cell 10 is erased in FIG. 3A by applying approximately 18 V to bit line BL, P+ source 20, and N-well 12 while grounding select gate 28 and control gate 36 (FIG. 2). Electrons tunnel from floating gate 26 through the entire length of tunneling oxide layer 34 into channel 30, source 20, and drain 22, thereby returning the threshold voltage of storage transistor 16 to its normal erased state value of approximately –4 V. Note that electrons will tunnel from floating gate 26 and thereby erase cell 10 only if the voltage on drain 24 is approximately 18 volts.

In another embodiment, cell 10 in FIG. 3A may be erased by applying approximately 8 V to bit line BL, P+ source 20, and N-well 12 while grounding select gate 28 and applying approximately –10 V to control gate 36 (FIG. 2). The application of these erase voltages, which results in an erasing of cell 10 in a manner identical to that described earlier, advantageously requires lower erasing voltages.

Where it is desired to read cell 10, in FIG. 3A, approximately ($V_{cc}$–2V) is applied as a read voltage to control gate 36 (FIG. 2) and $V_{cc}$ is applied to P+ source 20 and to N-well 12. Select gate 28 is grounded. A voltage less than $V_{cc}$ is applied to P+ drain 24 via bit line BL. Cell 10 will conduct channel current only if cell 10 is programmed, i.e., only if there is negative charge stored in floating gate 26. Thus, since a read current flows through cell 10 when floating gate 26 is negatively charged, a programmed cell 10 does not suffer from read disturb problems characteristic of conventional N-channel EEPROM cells. When cell 10 is in an erased state, the voltage on floating gate 26 is always less than the voltage on drain 22. In this manner, cell 10 does not exhibit read disturb problems when in an erased state.

Acceptable ranges for the above-described reading, erasing, and programming bias conditions for cell 10 are provided below in Table 1.

TABLE 1

| | | Electrical bias conditions | | | |
|---|---|---|---|---|---|
| Mode | Bit Line | Select Gate | Source | N-well | Control Gate |
| Program | 0 V | 0 V | 5–15 V | 5–15 V | 5–15 V |
| Erase (option 1) | 3–15 V | 0 V | 3–15 V | 3–15 V | –3 to –15 V |
| Erase (option 2) | 15–22 V | 0 V | 15–22 V | 15–22 V | 0 V |
| Read | less than Vcc | 0 V | Vcc | Vcc | 0 to Vcc |

The above-described operation of cell 10 utilizes PMOS characteristics to achieve advantages over conventional N-channel single poly semiconductor memory cells. The characteristic gate current for P-channel devices is approximately 50 times that of N-channel devices. Thus, unlike conventional NMOS EPROM cells which typically require approximately a 0.5 milli-amp programming current to charge the floating gate, cell 10 requires a programming current of only a few micro-Amps. Requiring a programming current greater than one order of magnitude smaller than that of conventional NMOS memory cells such as EPROMs not only allows cell 10 to reduce power consumption during programming but also allows for page writing, i.e., to simultaneously write to numerous ones of cells 10 in a row of an associated memory array (not shown).

It is known that the channel of conventional NMOS EEPROM memory cells must be of a sufficient length to tolerate the typically high reverse bias voltage across the P-well/N+ drain junction (as well as the resultant high electric field) required during programming and erasing via electron tunneling. As a result, it is difficult to further reduce the size of such conventional EEPROM cells without incurring destructive junction stress. Since, however, the operation of cell 10 neither requires nor utilizes high voltage biases across the N-well/drain junction during programming and erasing (see Table 1), the channel length of cell 10 is not so limited. This feature allows cell 10 to be fabricated using 0.18 µm technology, thereby resulting in cell 10 being of a smaller size than conventional N-channel single-poly EEPROM cells. For instance, while cell 10 is only about 25 µm$^2$ using 0.5 µm technology, conventional N-channel single poly EEPROM cells are typically on the order of 160

μm² using 0.5 μm technology. Avoiding such high junction biases during erasing also advantageously results in a more durable and reliable memory cell.

Note that as the channel length of an NMOS transistor falls below approximately 0.7 μm, electron mobility saturates. In PMOS devices, however, hole mobility continues to increase as the channel length decreases below 0.7 μm and becomes comparable to electron mobility as the gate length is further decreased. Accordingly, minimizing the channel lengths of storage transistor 16 and select transistor 18 advantageously results in a hole mobility comparable to that of electrons, thereby increasing the accessing speed of cell 10. Further, note that programmed cell 10 in deep depletion allows for a higher read current and thus for faster read speeds.

As described above and shown in Table 1, the PMOS single poly cell 10 requires only 8.5 V for programming and erasing, as compared to the 20 V required for programming and erasing conventional NMOS single poly EEPROM cells, and is thus more readily adaptable to the low voltage operation of a standard logic process.

Figure 3B:
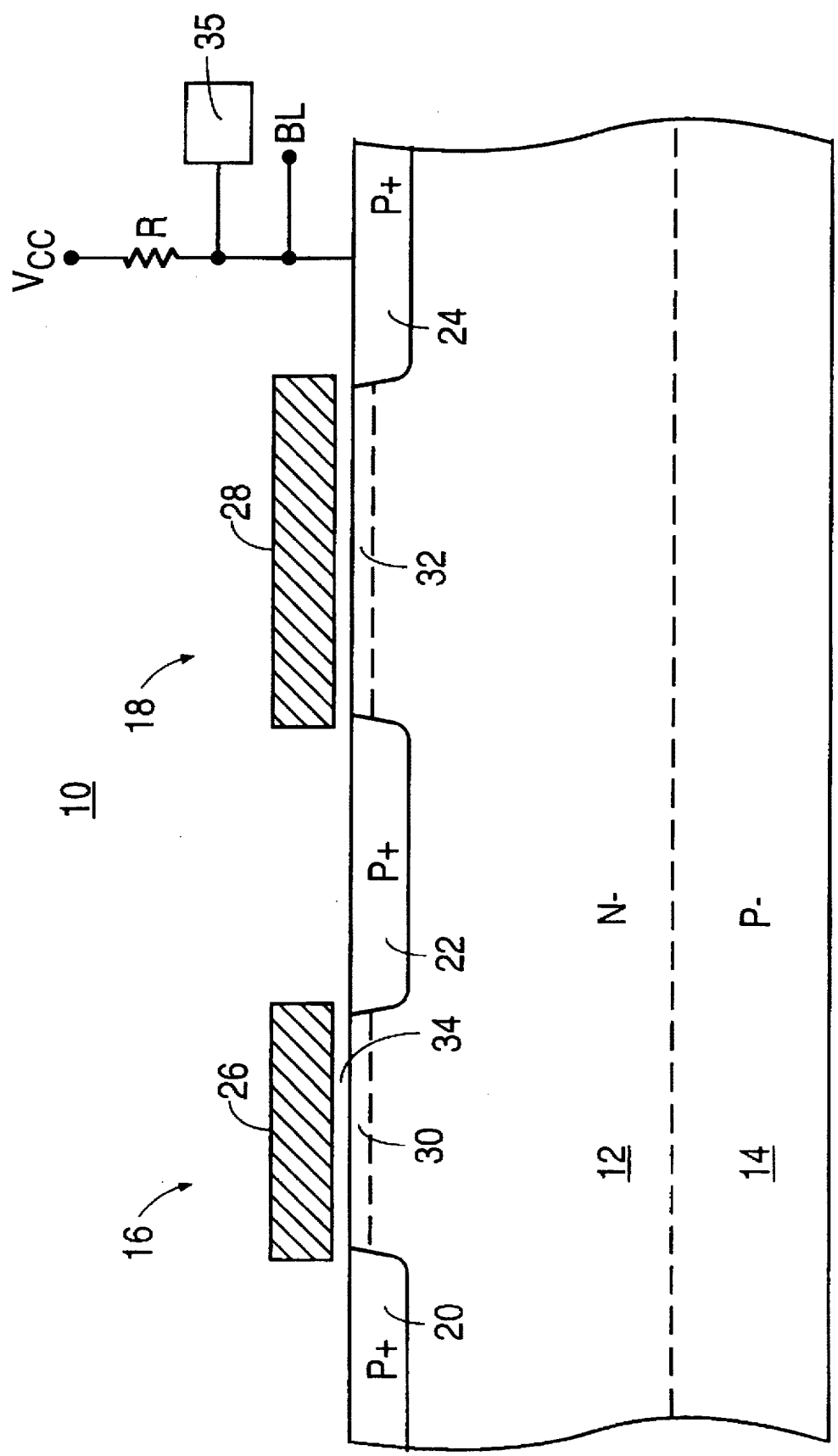
Figure 4:
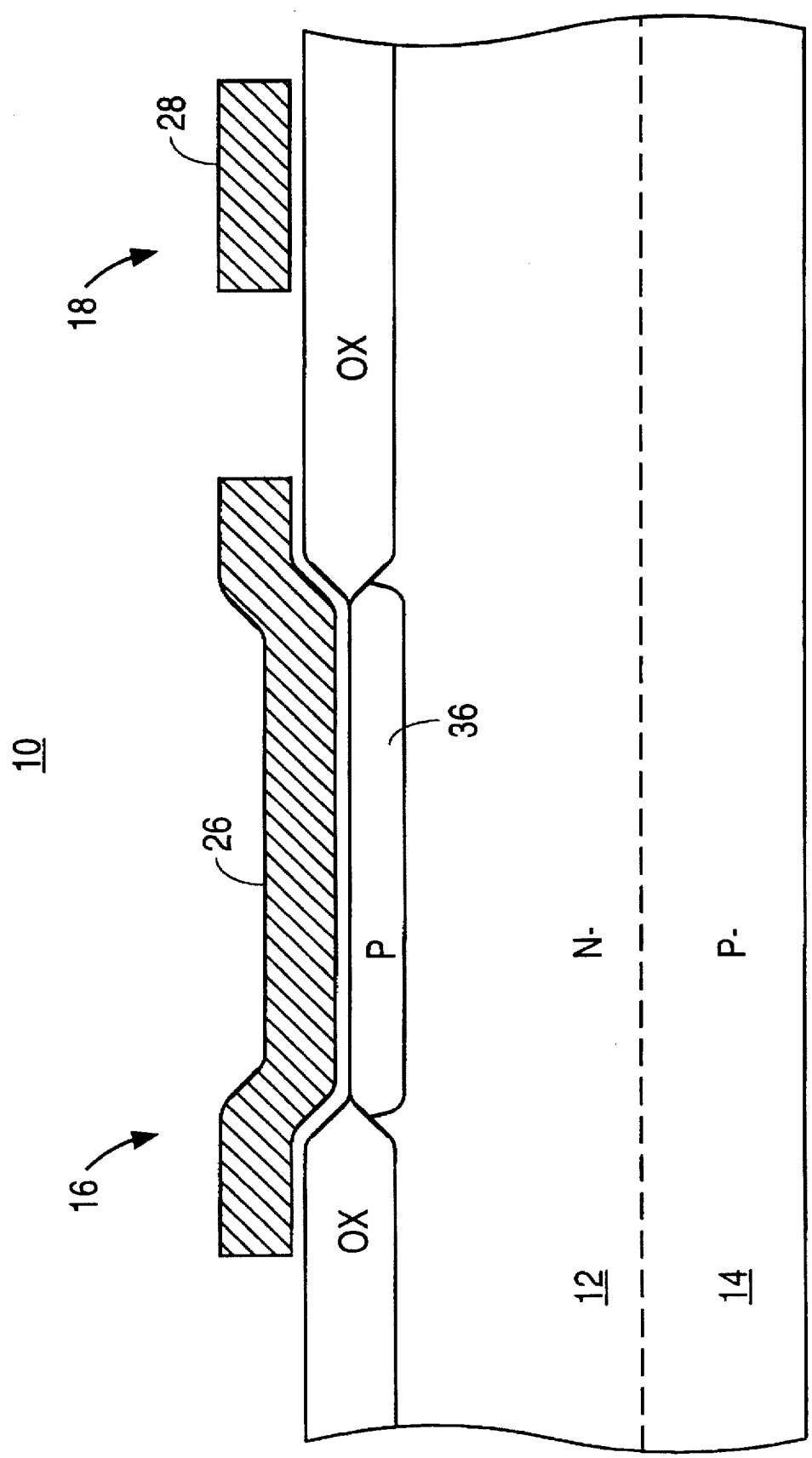
FIG. 4 is a cross-sectional view of the cell of FIG. 1 taken along line C—C.

Cell 10 is also capable of storing numerous bits of binary data by programming storage transistor 16 to one of many different threshold voltage $V_t$ levels, where the $V_t$ levels depend on, and are thus determined by, the voltage applied to control gate 36. In such multi-level threshold voltage applications, where it is necessary to accurately measure the threshold voltage $V_t$ of storage transistor 16, drain 24 of select transistor 18 is coupled to $V_{cc}$ through a high impedance resistor R and to a voltage sensing circuit 35, as shown in FIG. 3B. Sensing circuit 35 allows for accurate determination of the threshold voltage $V_t$, and thus the multiple-bit data stored in cell 10. In such multi-level applications, cell 10 has in its natural state a threshold voltage $V_t$ of approximately −6 V and has in its fully charged state a threshold voltage $V_t$ of approximately 9 V. Using a range of voltages from 5 V to 15 V as the program voltage $V_p$ applied to control gate 36 during programming, the threshold voltage $V_t$ of storage transistor 16 may be set between approximately −1 V and 9 V. Assuming $V_{cc}$ to be approximately 5 V, the range of bit line BL voltages produced in response to varying the threshold voltage $V_t$ is approximately 1 to 5 volts, thereby resulting in a 4 V range. Since the threshold voltage $V_t$ of storage transistor 16 may be programmed in 4 mV increments, 1000 levels of programming are possible with cell 10. Acceptable ranges for bias conditions during programming, reading, and erasing cell 10 for multi-level applications are listed below on Table 2.

TABLE 2

| | | Electrical bias conditions | | | |
|---|---|---|---|---|---|
| Mode | Bit Line | Select Gate | Source | N-well | Control Gate |
| Program (option 1) | 0 V | 0 V | 5–15 V | 5–15 V | desired $V_p$, i.e., (5–15 V) |
| Program (option 2) | 0 V | 0 V | 5–15 V | 5–15 V | ramp up to desired $V_p$ |
| Erase (option 1) | 3–15 V | 0 V | 3–15 V | 3–15 V | −3 to −15 V |
| Erase (option 2) | 15–22 V | 0 V | 15–22 V | 15–22 V | 0 V |
| Read (option 1) | less than Vcc | 0 V | Vcc | Vcc | 0 to Vcc |
| Read (option 2) | pre-charge to Vcc | 0 V | 0 V | Vcc | 0 V |

Figure 5:
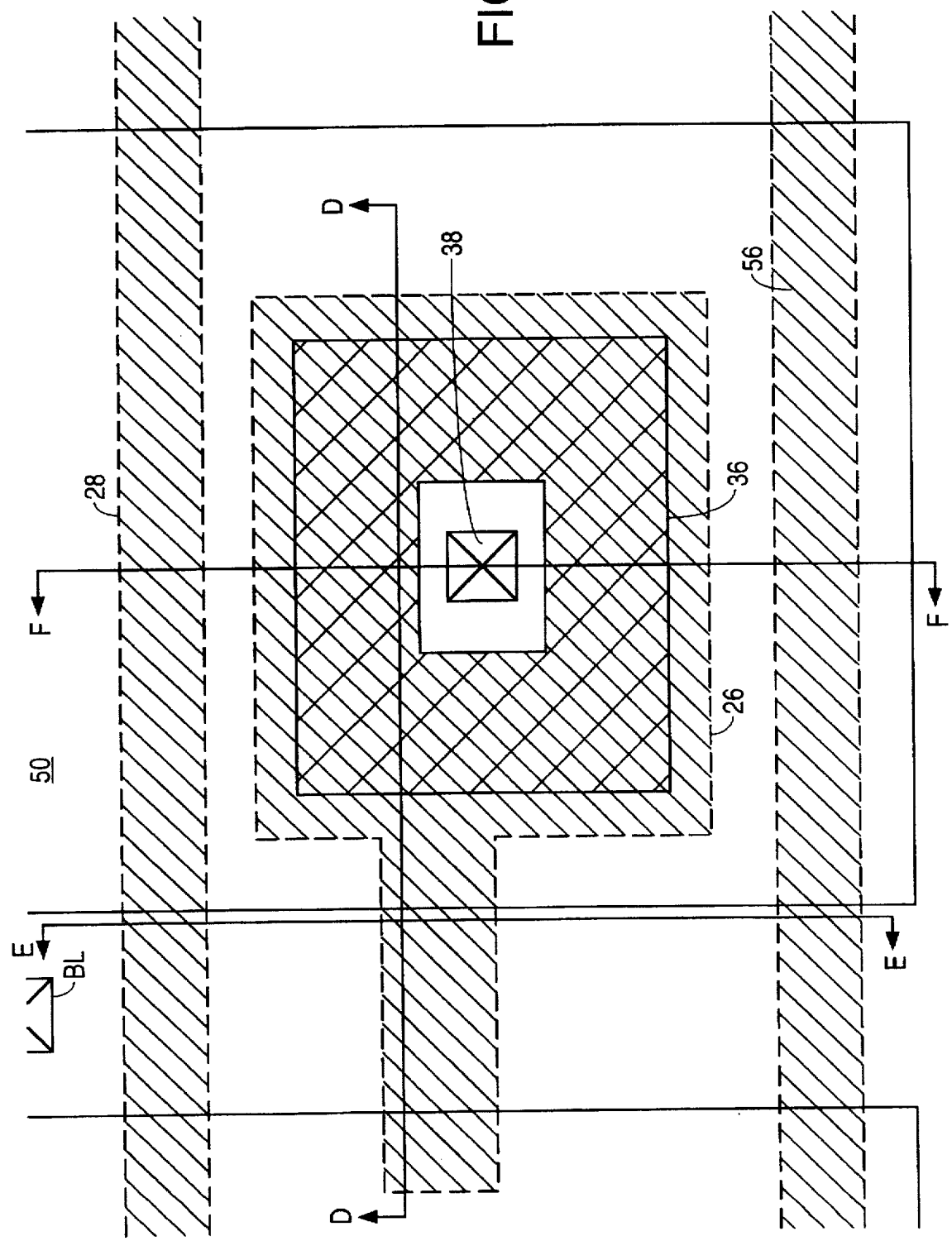
FIG. 5 is a top view of a PMOS single-poly EEPROM cell in accordance with the present invention.
Figure 6:
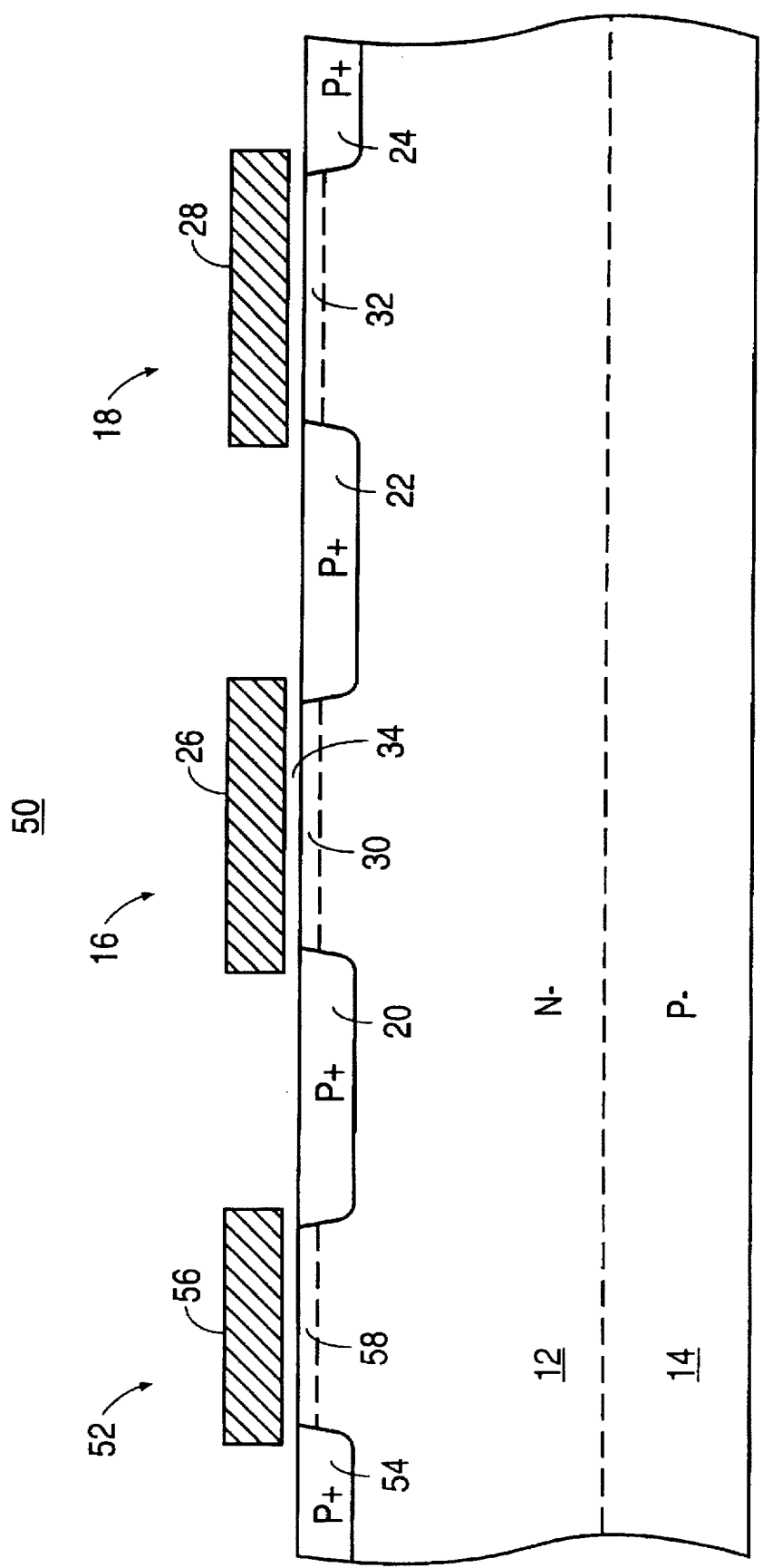
FIG. 6 is a cross-sectional view of the cell of FIG. 5 taken along line E—E.
Figure 7:
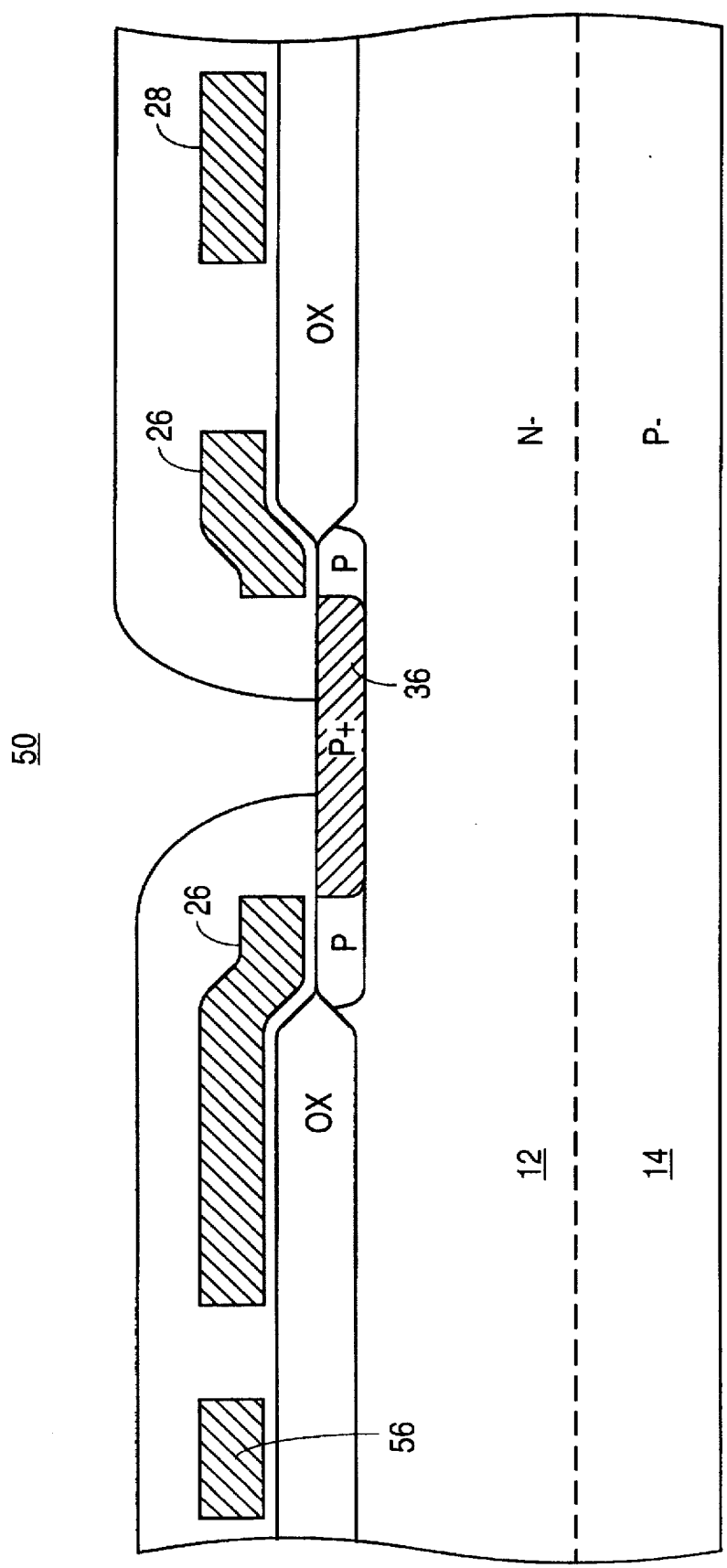
FIG. 7 is a cross-sectional view of the cell of FIG. 5 taken along line F—F.
Figure 8:
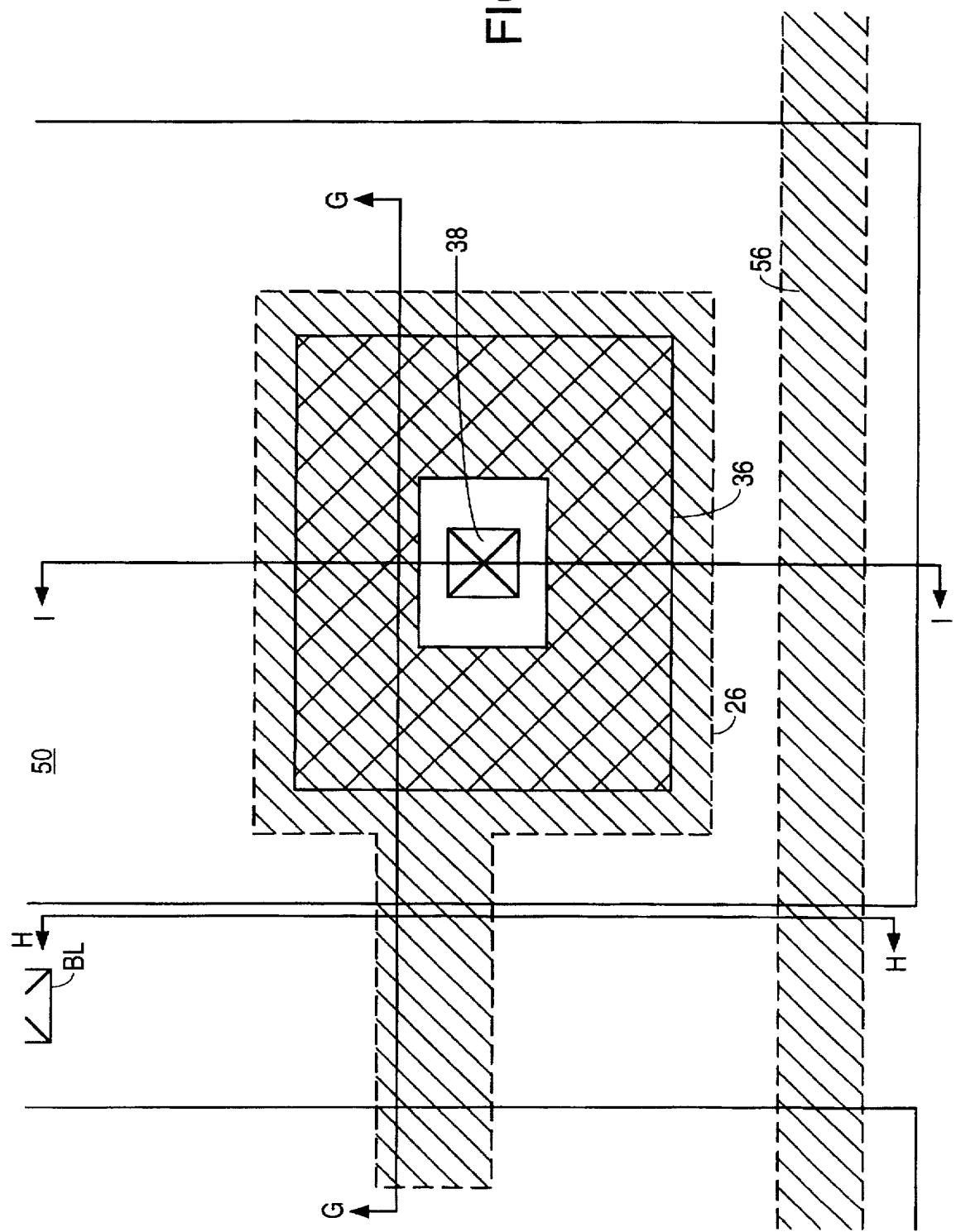
FIG. 8 is a top view of a PMOS single-poly memory cell in accordance with the another embodiment of the present invention.
Figure 9:
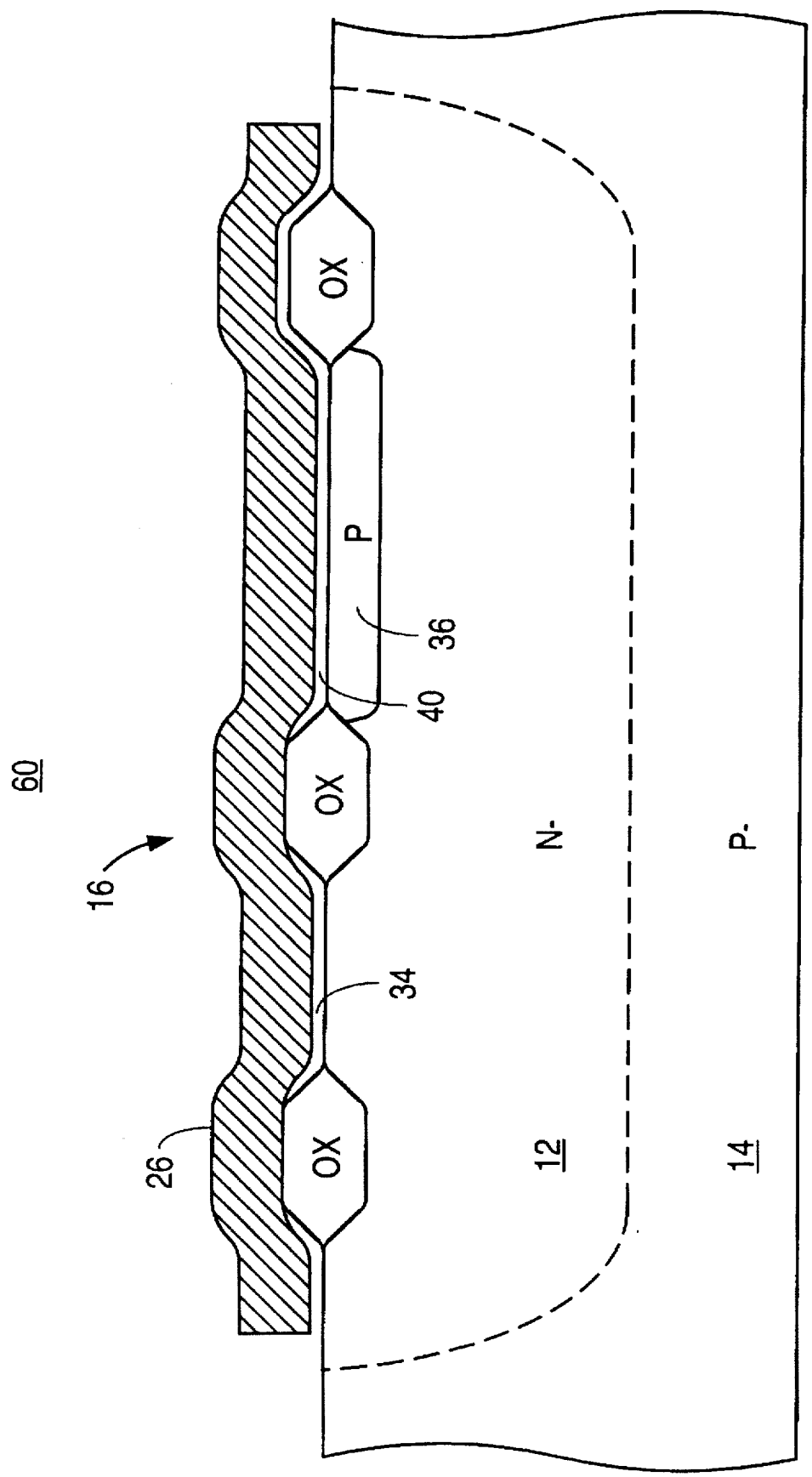
FIG. 9 is a cross-sectional view of the cell of FIG. 8 taken along line G—G.

In other embodiments, the structure of cell 10 may be incorporated into a larger PMOS single-poly EEPROM cell 50. Referring to FIGS. 5–7 (note that the cross-sectional view taken along line D—D is identical to that shown in FIG. 2), cell 50 is shown in FIG. 6 formed in N-well 12 and includes a source select transistor 52 on the source side of cell 10. Note that those components common to cells 10 and 50 are appropriately labeled with the same numerals. P+ diffusion regions 54 and 20 serve as the source and drain, respectively, of select transistor 52. A poly-silicon gate 56 controls an underlying channel region 58. The programming, erasing, and reading operations of cell 50 are nearly identical to that described with respect to cell 10 and will thus not be discussed in detail here. Acceptable ranges for the bias conditions for programming, erasing, and reading are listed below in Table 3. The addition of source select transistor 52 to cell 10 results in an EEPROM cell 50 that is both bit-to-bit programmable and bit-to-bit erasable. In this manner, erasing flexibility is increased.

TABLE 3

| | Bit line | Drain select gate | Source select gate | Source | N-well | Cell control gate |
|---|---|---|---|---|---|---|
| Program | 0 V | 0 V | * | 5 V–15 V | 5 V–15 V | 5–15 V |
| Erase (option 1) | 3 V–15 V | 0 V | 3 V–15 V | 3 V–15 V | 3 V–15 V | −3 V to −15 V |
| Erase (option 2) | 15 V–22 V | 0 V | 15 V–22 V | 15 V–22 V | 15 V–22 V | 0 V |
| Read | less than Vcc | 0 V | 0 V | Vcc | Vcc | 0 V to Vcc |

*0 to (source voltage - 1 V)

In a manner similar to that described above with respect to cell 10, cell 50 may be used in multi-level threshold voltage applications. In such applications, drain 24 of drain select transistor 18 is coupled to $V_{cc}$ through a high impedance resistor R (not shown) and to a voltage sensing circuit (not shown). The sensing circuit allows for accurate determination of the threshold voltage $V_t$, and thus the multiple-bit data stored in cell 50. Acceptable ranges for bias conditions during programming, reading, and erasing cell 50 for multi-level applications are listed below in Table 4.

TABLE 4

| | Bit line | Drain select gate | Source select gate | Source | N-well | Cell control gate |
|---|---|---|---|---|---|---|
| Program (option 1) | $V_p$ | 0 V | 3 V–15 V | 3 V–15 V | 3 V–15 V | –3 V to –15 V |
| Program (option 2) | $V_p$ | 0 V | 15 V–22 V | 15 V–22 V | 15 V–22 V | 0 V |
| Erase | 0 V | 0 V | * | 5 V–15 V | 5 V–15 V | 5 V–15 V |
| Read (option 1) | less than Vcc | 0 V | 0 V | Vcc | Vcc | 0 to Vcc |
| Read (option 2) | pre-charge to Vcc | 0 V | 0 V | 0 V | Vcc | 0 V |

*0 to (source voltage - 1 V)

Figure 10:
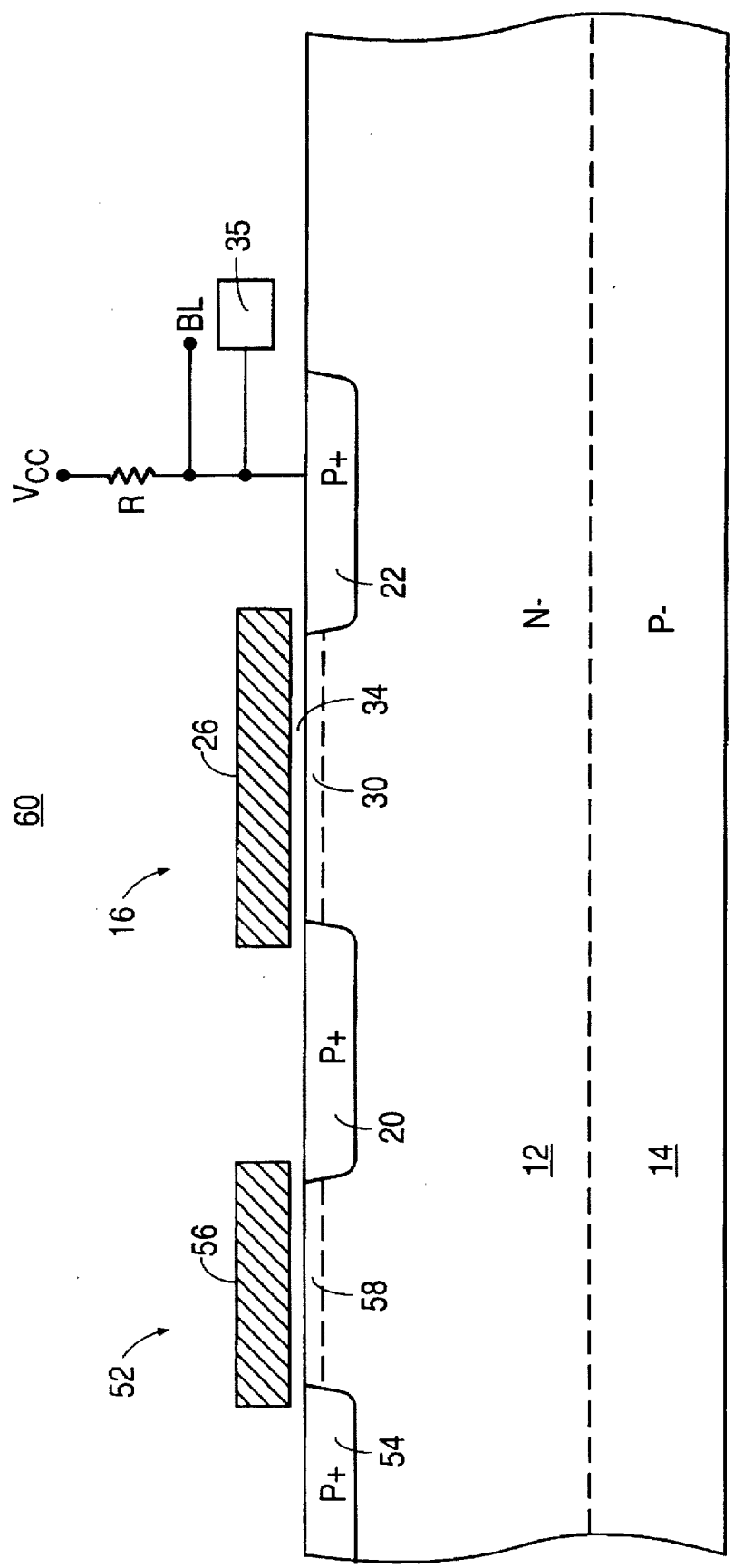
FIG. 10 is a cross-sectional view of the cell of FIG. 8 taken along line H—H.
Figure 11:
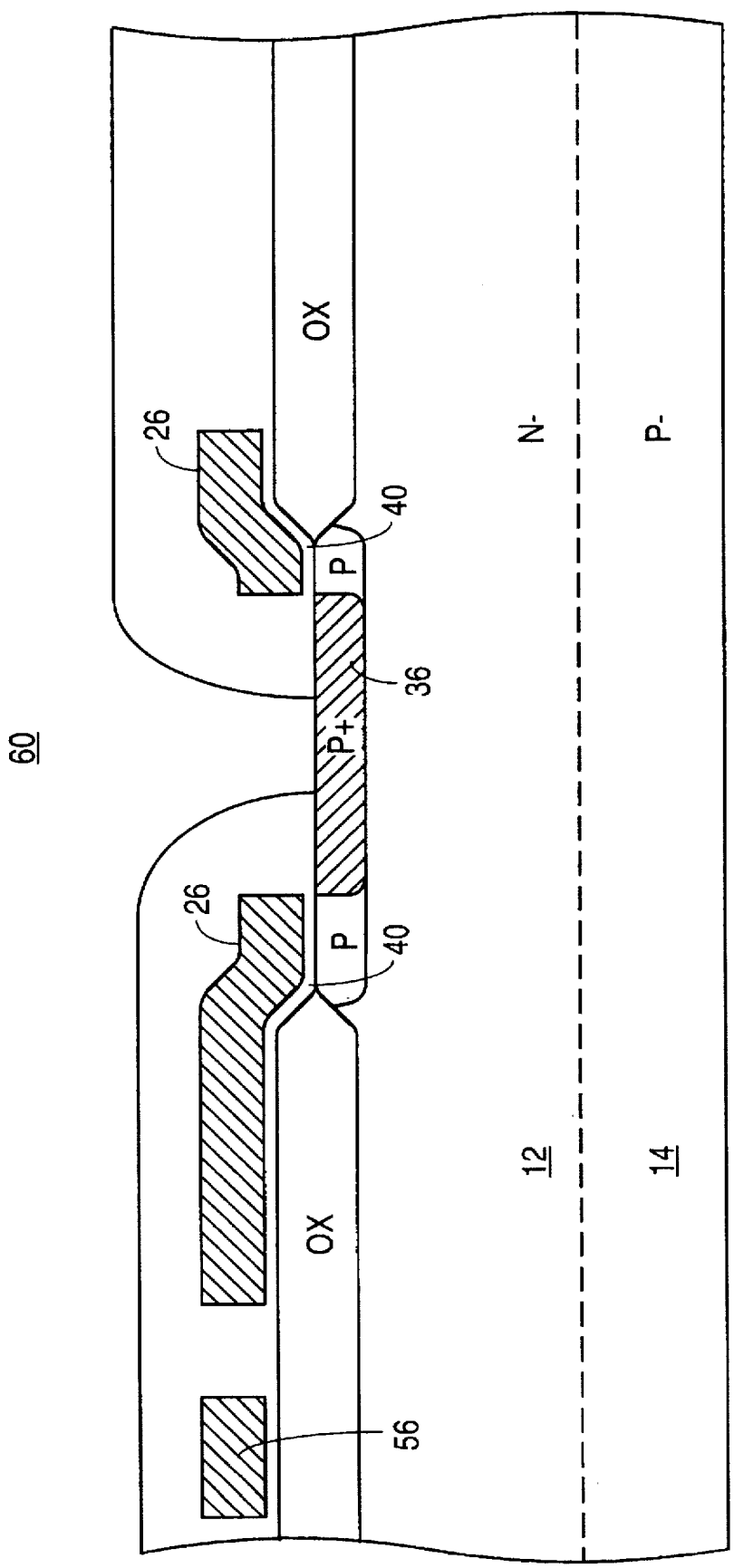
FIG. 11 is a cross-sectional view of the cell of FIG. 8 taken along line I—I.

In yet another embodiment in accordance with the present invention as shown in FIGS. 8–11, cell 60 in FIG. 10 includes storage transistor 16 which is coupled directly to bit line BL and source select transistor 52 which is coupled to source 20 of storage transistor 16, where those components common to cells 10, 50, and 60 are appropriately labeled with the same numerals. Note that drain 22 of storage transistor 16 may be coupled to $V_{cc}$ via high impedance resistor R and also to voltage sensing circuit 35 to enable accurate determination of the programmed threshold voltage $V_t$ of storage transistor 16. Cell 60 is of a smaller size than cell 50 and allows for column, or sector, erasing. The operation of cell 60 is similar to that described above with respect to cell 50. Acceptable bias condition ranges for programming, erasing, and reading cell 60 are listed below in Table 5.

TABLE 5

| | Bit line | Source select gate | Source | N-well | Cell control gate |
|---|---|---|---|---|---|
| Program (option 1) | 0 V | 0 V | 5 V–15 V | 5 V–15 V | 5 V–15 V |
| Program (option 2) | 0 V | 0 V | 5 V–15 V | 5 V–15 V | 0 V ramped up to 5 V–15 V |
| Erase (option 1) | 3 V–15 V | 0 V | 3 V–15 V | 3 V–15 V | –3 V to –15 V |
| Erase (option 2) | 15 V–22 V | 0 V | 15 V–22 V | 15 V–22 V | 0 V |
| Read | less than Vcc | 0 V | Vcc | Vcc | 0 V to Vcc |

*0 to (source voltage - 1 V)

In a manner similar to that described above with respect to cell 10, cell 60 may be used in multi-level threshold voltage applications. Acceptable ranges for bias conditions during programming, reading, and erasing cell 60 for multi-level applications are listed below in Table 6.

TABLE 6

| Mode | Bit Line | Select Gate | Source | N-well | Control Gate |
|---|---|---|---|---|---|
| Program (option 1) | 0 V | 0 V | 5–15 V | 5–15 V | desired $V_p$, i.e, (5–15 V) |
| Program (option 2) | 0 V | 0 V | 5–15 V | 5–15 V | ramp up to desired $V_p$ |
| Erase (option 1) | 3–15 V | 0 V | 3–15 V | 3–15 V | –3 to –15 V |
| Erase (option 2) | 15–22 V | 0 V | 15–22 V | 15–22 V | 0 V |
| Read (option 1) | less than Vcc | 0 V | Vcc | Vcc | 0 to Vcc |
| Read (option 2) | pre-charge to Vcc | 0 V | 0 V | Vcc | 0 V |

The above-described embodiments in which single-poly transistor 16 is used as the storage cell suffer from a common drawback. Referring to FIG. 2, the P/N junction between control gate 36 and N-well 12 must remain reverse biased to prevent a large and undesirable current flow from control gate 36 to N-well 12. Accordingly, the voltage applied to control gate 36 should never exceed the voltage of N-well 12 by more than approximately 0.6. As a result, the voltage coupled to floating gate 26 via control gate 36 is limited by the amount of voltage applied to N-well 12, thereby unnecessarily restricting the performance of transistor 16.

Figure 12:
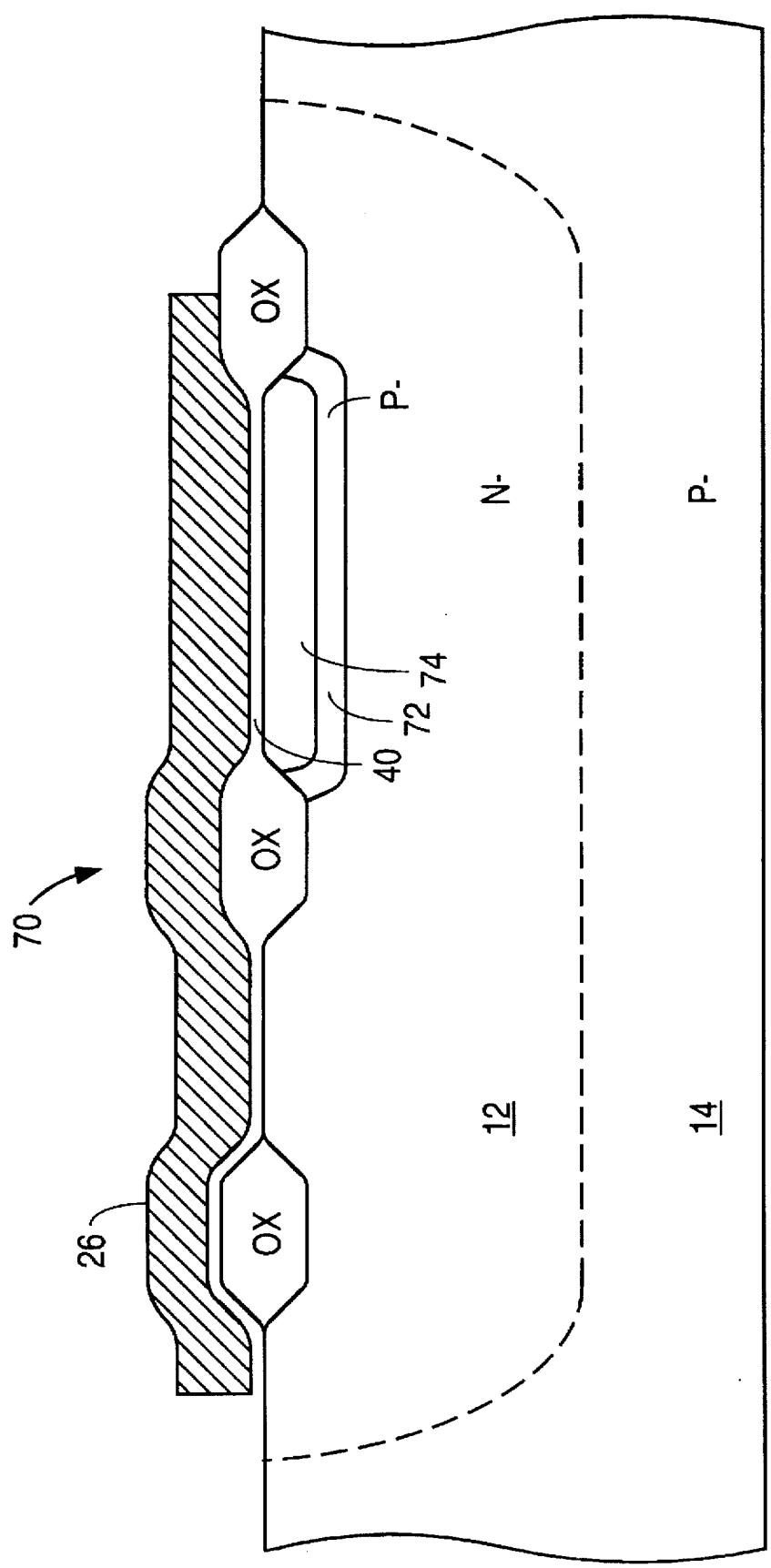
FIG. 12 is a cross-sectional view of a memory cell in accordance with yet another embodiment of the present invention.

In accordance with another embodiment of the present invention, a single-poly storage transistor 70 is provided, the performance of which is not so restricted. Referring now to FIG. 12, note that transistor 70 is identical to transistor 16 is every respect except for the structure of buried control gate 74, the operation and advantages of which will be described below. Accordingly, all components common to transistor 70 and transistor 16 (FIGS. 1–4) are appropriately labeled with same numerals.

Transistor 70 has a P-type diffusion region 72 within N-well 12. An N type diffusion region 74 is formed within P– diffusion region 72. N diffusion region 74 serves as the control gate for transistor 70, while P– diffusion region 72 insulates control gate 74 from N-well 12. Note that N-type control gate 74 may be electrically coupled to a contact in the manner described above with respect to cell 10 (FIGS. 1–4). Since control gate 74 is N type and is formed within P– diffusion region 72, the voltage on control gate 74 may exceed the voltage of N-well 12 without causing an undesirable current flow from control gate 74 to N-well 12. The elimination of such a restriction of the voltage of control gate 74 allows transistor 70 to go even further into depletion when programmed, thereby resulting in a higher read current and thus a faster memory cell.

Storage transistor 70 may replace transistor 16 is any of the above described memory cells 10, 50, and 60 to allow for faster access times. Tables 7, 8, and 9 list acceptable bias conditions for the programming, erasing, and reading of cells 10, 50, and 60, respectively, when employing transistor 70 as the storage element (as opposed to employing transistor 16).

TABLE 7

| Mode | Bit Line | Select Gate | Source | N-well | Control Gate |
|---|---|---|---|---|---|
| Program (option 1) | 0 V | 0 V | 5–15 V | 5–15 V | 5–17 V |
| Program (option 2) | 0 V | 0 V | 5–15 V | 5–15 V | ramp up to between 5–17 V from 0 V |
| Erase (option 1) | 3–15 V | 0 V | 3–15 V | 3–15 V | –3 to –15 V |
| Erase (option 2) | 15–22 V | 0 V | 15–22 V | 15–22 V | 0 V |
| Read | less than Vcc | 0 V | Vcc | Vcc | 0 to Vcc |

TABLE 8

| | Bit line | Drain select gate | Source select gate | Source | N-well | Cell control gate |
|---|---|---|---|---|---|---|
| Program | 0V | 0V | * | 5V–15V | 5V–15V | 5–17V |
| Erase (option 1) | 3V–15V | 0V | 3V–15V | 3V–15V | 3V–15V | –3V to –15V |
| Erase (option 2) | 15V–22V | 0V | 15V–22V | 15V–22V | 15V–22V | 0V |
| Read | less than Vcc | 0V | 0V | Vcc | Vcc | 0V to Vcc |

*0 to (source voltage – 1V)

TABLE 9

| | Bit line | Source Select Gate | Source | N-well | Cell control gate |
|---|---|---|---|---|---|
| Program (option 1) | 0V | 0V | 5V–15V | 5V–15V | 5V–17V |
| Program (option 2) | 0V | 0V | 5V–15V | 5V–15V | ramp from 0V up to between 5V–17V |
| Erase (option 1) | 3V–15V | 0V | 3V–15V | 3V–15V | −3 to −15V |
| Erase (option 2) | 15V–22V | 0V | 15V–22V | 15V–22V | 0V |
| Read | less than Vcc | 0V | Vcc | Vcc | 0V to Vcc |

*0 to (source voltage − 1V)

Further, those embodiments of cells 10, 50, and 60 which employ as storage elements transistor 70 are also capable of multi-level threshold voltage applications, the operation of which has been described above. Acceptable bias condition ranges for the programming, erasing, and reading of cells 10, 50, and 60 which employ transistor 70 are provided below in Tables 10, 11, and 12, respectively.

TABLE 10

| | Electrical bias conditions | | | | |
|---|---|---|---|---|---|
| Mode | Bit Line | Select Gate | Source | N-well | Control Gate |
| Program (option 1) | 0V | 0V | 5–15V | 5–15V | ramp up to desired $V_p$ |
| Program (option 2) | 0V | 0V | 5–15V | 5–15V | desired $V_p$ |
| Erase (option 1) | 3–15V | 0V | 3–15V | 3–15V | −3 to −15V |
| Erase (option 2) | 15–22V | 0V | 15–22V | 15–22V | 0V |
| Read (option 1) | less than Vcc | 0V | Vcc | Vcc | 0 to Vcc |
| Read (option 2) | pre-charge to Vcc | 0V | 0V | Vcc | 0V |

TABLE 11

| | Bit line | Drain select gate | Source select gate | Source | N-well | Cell control gate |
|---|---|---|---|---|---|---|
| Program (option 1) | $V_p$ | 0V | 3V–15V | 3V–15V | 3V–15V | −3V to −15V |
| Program (option 2) | $V_p$ | 0V | 15V–22V | 15V–22V | 15V–22V | 0V |
| Erase | 0V | 0V | * | 5V–15V | 5V–15V | 5V–17V |
| Read (option 1) | less than Vcc | 0V | 0V | Vcc | Vcc | 0 to Vcc |
| Read (option 2) | pre-charge to Vcc | 0V | 0V | 0V | Vcc | 0V |

* 0 to (source voltage − 1 V)

TABLE 12

Electrical bias conditions

| Mode | Bit Line | Select Gate | Source | N-well | Control Gate |
|---|---|---|---|---|---|
| Program (option 1) | 0V | 0V | 5V–15V | 5V–15V | desired $V_p$, i.e, (5–17V) |
| Program (option 2) | 0V | 0V | 5V–15V | 5V–15V | ramp up to desired $V_p$ |
| Erase (option 1) | 3V–15V | 0V | 3V–15V | 3V–15V | –3V to –15V |
| Erase (option 2) | 15V–22V | 0V | 15V–22V | 15V–22V | 0V |
| Read (option 1) | less than Vcc | 0V | Vcc | Vcc | 0 to Vcc |
| Read (option 2) | pre-charge to Vcc | 0V | 0V | Vcc | 0V |

The advantageous operational characteristics of the above described embodiments allow for such embodiments to be fabricated by a process simpler than those conventional processes used to fabricate N-channel single-poly EEPROM cells. The fabrication of cell 10 will be described below in the context of a larger CMOS structure 100 which includes PMOS and NMOS peripheral transistors (these peripheral transistors may be used for instance as address decoders, current sensors, select transistors, and on). Although described below in the context of fabricating cell 10 in a twin well structure, it is to be noted the process described below may be easily modified so that cell 10 may be formed in an N-well structure. Further, the process described below may also be used to fabricate cell 50, 60, or 70 in either an N-well or a twin well structure.

Figure 13:
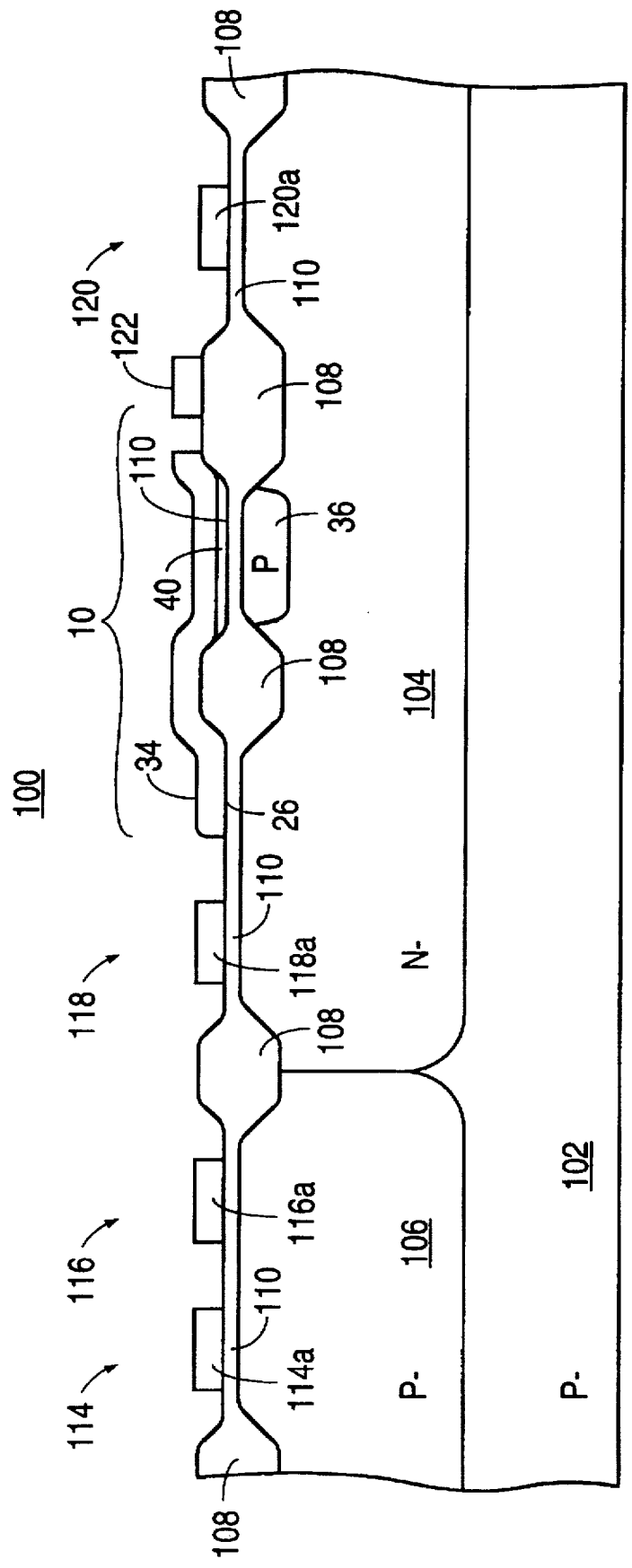
FIGS. 13 and 14 illustrate the fabrication of a P-channel single-poly memory cell in accordance with the present invention.

Referring now to FIG. 13, structure 100 includes a P-type substrate 102 having formed by conventional means therein an N-well 104 and a P-well 106. The resistivity and thickness of N-well 104 and P-well 106 will depend upon the desired characteristics of the devices to be formed therein. A LOCOS process is used to form isolation regions which will electrically insulate later-formed transistors from one another. Field oxide regions 108 approximately 7500 Å thick and a layer of sacrificial oxide (not shown) approximately 240 Å thick are formed on a top surface of substrate 102 by any suitable means.

Structure 100 is masked by any suitable means (not shown) such as for instance photoresist. P-type dopants such as $BF_2$ are implanted at an energy of 50 keV and a dosage of 1E14 ions/cm² into N-well 104 to form a P diffusion region 36 which will serve as the control gate for cell 10 (see also FIG. 2). The mask is then removed.

A layer of poly-silicon is deposited over a top surface of field oxide regions 108 and gate oxide 110 and selectively etched to form the pattern shown in FIG. 13. Portions 114a and 116a will serve as gates for NMOS peripheral transistors 114 and 116, respectively, while portions 118a and 120a will serve as gates for PMOS peripheral transistors 118 and 120, respectively. Portion 122 may serve as an interconnection between devices formed within structure 100. Portion 26 will serve as the floating gate of cell 10.

The process steps used for threshold voltage implants and channel stop implants for cell 10 and peripheral transistors 114, 116, 118, and 120, as well as for the formation of tunnel oxide 34 and oxide layer 40 separating floating gate 26 from control gate 36 of cell 10, are not shown in the Figures or discussed herein for simplicity. In the preferred embodiment, Arsenic is implanted at an energy of 100 keV and a dosage of 2E13 ions/cm² as the threshold voltage implant for cell 10. Further, gate oxide layer 110 may also be implemented according to well known techniques and are thus described herein. Note, however, that as discussed above with respect to FIG. 3A, it is not necessary to open a tunnel window in tunnel oxide layer 34, thereby saving at least one masking step over conventional processes used to form N-channel single-poly EEPROM cells. Note that these just described process steps should be performed before the formation of gates 114, 116, 118, and 120, floating gate 26 and contact 122.

Figure 14:
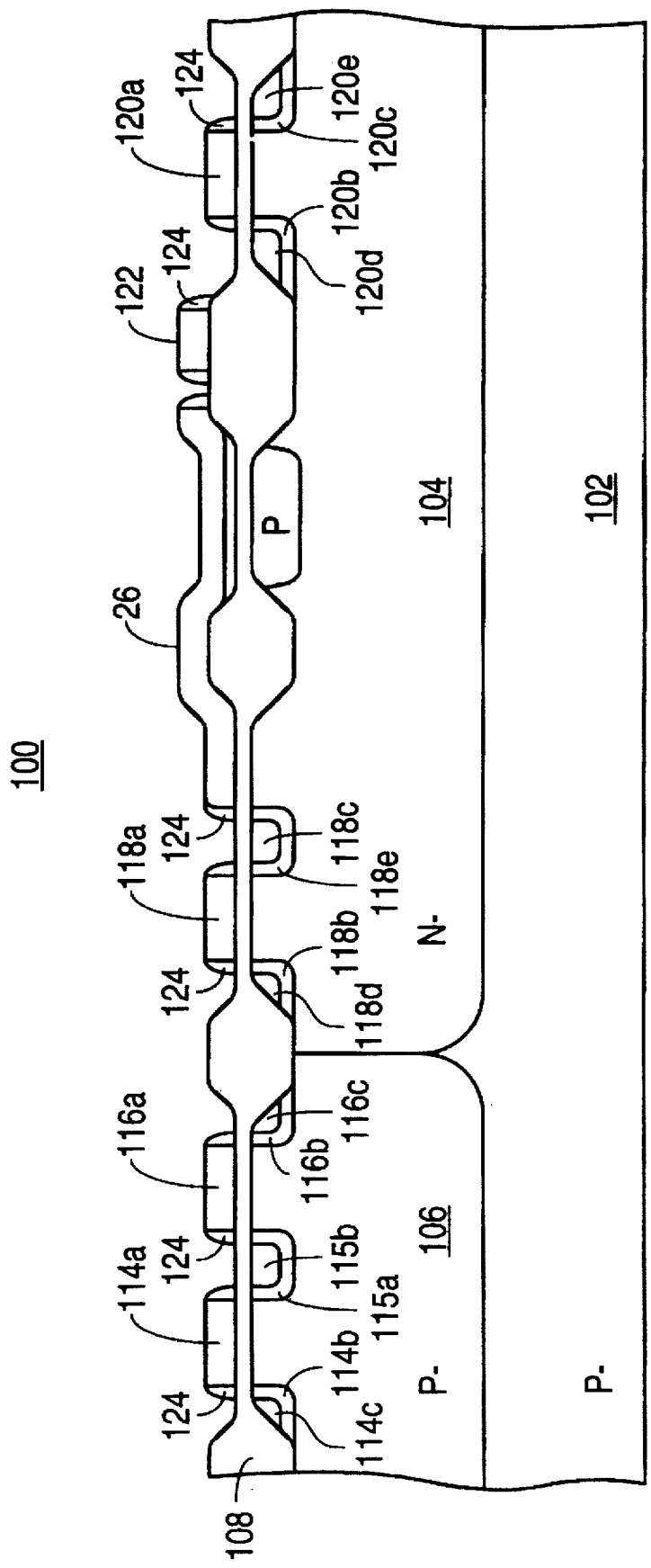

Referring now to FIG. 14, PMOS cell 10 and PMOS transistors 118, and 120 are masked (not shown). N-type dopants such as Phosphorus are implanted at an energy of approximately 40 keV and a dosage of approximately 3E13 ions/cm² into P-well 106 to form N-regions 114b, 115a, and 116b. The mask is then removed.

NMOS transistors 114 and 116 are then masked (not shown) and P-type dopants such as $BF_2$ are implanted at an energy of approximately 60 keV and a dosage of approximately 7E12 ions/cm² into N-well 104 to form N-regions 118b, 118c, 120b, and 120c. Sidewall oxide spacers 124 are then formed by conventional means on the sides of control gates 114, 116, 118, and 120, layer 122, and floating gate 26.

PMOS cell 10 and PMOS peripheral transistors 118 and 120 are again masked and N-type dopants, preferably Arsenic, are implanted at an energy of 80 keV and a dosage of 6E15 ions/cm² into P-well 106 to form N+ diffusion regions 114c, 115b, and 116c, as shown in FIG. 14. N–/N+ diffusion region 114b/114c serves as the source for NMOS transistor 114, N–/N+ diffusion region 115a/115b serves as the drain for NMOS transistor 114 and the source for NMOS transistor 116, and N–/N+ diffusion region 116b/116c serves as the drain for NMOS transistor 116. The PMOS mask is then removed.

Structure 100 is again masked and the sidewall spacers 124 on the source and drain sides of floating gate 26 are dipped and removed. This ensures that in a subsequent doping step the source and drain regions (see FIG. 3A) of cell 10 will be of a P+ diffusion structure, as opposed to the lightly doped drain (LDD) structure of P–/P+ diffusion region 118c/118e. After this mask is removed, NMOS peripheral transistors 114 and 116 are masked and P-type implants, preferably $BF_2$, are implanted at an energy of 50 keV and a dosage of 2E15 ions/cm² into N-well 104 to form P+ regions 118d, 118e, 120d, and 120e, as well as P+ source 20 and P+ drain 22 regions (see FIG. 3) of cell 10. The P–/P+ diffusion regions 118b/118d and 118c/118e serve as the source and drain regions, respectively, of PMOS transistor 118, while P–/P+ diffusion regions 120b/120d and 120c/120e serve as the source and drain regions, respectively, of PMOS transistor 120.

The remaining portions of structure 100 may be completed according to well known fabrication techniques.

The process described above with respect to FIGS. 13 and 14 requires fewer masking steps than do conventional processes used in the fabrication of N-channel single poly memory cells. Since the source and drain regions of cell 10 may be formed simultaneously with the source and drain regions of PMOS peripheral transistors 118 and 120, an additional masking step is saved. Further, since as described earlier the operation of cell 10 does not require high voltages across its drain/N-well junction, neither N-channel or P-channel high voltage implants are necessary, thereby resulting in a further elimination of masking steps. In this manner, the fabrication of cell 10 may be realized while reducing manufacturing costs.

It is to be noted that the above described fabrication process may be easily adapted to construct memory cells employing as memory elements single-poly transistors 70 in accordance with embodiments of the present invention. Further, while particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. In particular, the polarities of the bipolar and MOS transistors may be reversed while still realizing the benefits of the above described invention.

I claim:

1. A P channel single poly memory cell comprising:

a P+ source and a P+ drain formed in an N-well;

a channel extending between said source and said drain;

a layer of tunnel oxide formed on a surface of said N-well;

a floating gate overlying said tunnel oxide;

a P– diffusion region formed in a portion of said N-well underlying said floating gate; and an N diffusion region formed within said P– diffusion region, said N diffusion region serving as a control gate of said cell.

2. The structure of claim 1 wherein said cell is programmed by applying a first voltage to said drain, a second voltage to said source and to said N-well, and a third voltage to said control gate so as to cause the injection of hot electrons from said N-well to said floating gate.

3. The structure of claim 2 wherein said first, second, and third voltages are 0 volts, in the range of 5–15 volts, and in the range of 5–17 volts, respectively.

4. The structure of claim 2 wherein said cell is erased by applying a first voltage to said drain, a second voltage to said N-well and to said source, and a third voltage to said control gate.

5. The structure of claim 4 wherein said first, second, and third voltages are in the ranges of 3 to 15, 3 to 15, and –3 to –15 volts, respectively.

6. The structure of claim 4 wherein said first, second, and third voltages are in the ranges of 15 to 22, 15 to 22, and zero volts, respectively.

7. The structure of claim 2 further comprising a P-channel drain select transistor having a source coupled to said drain of said cell, a drain coupled to a bit line, and a gate.

8. The structure of claim 7 further comprising a P-channel source select transistor having a drain coupled to said source of said cell and having a source and a gate.

9. The structure of claim 2 further comprising a P-channel source select transistor having a drain coupled to said source of said cell and having a source and a gate.

10. The structure of claim 2 wherein said first voltage is approximately 0 volts, said second voltage is in the range of approximately 5–15 volts, and said third voltage is ramped from approximately 0 volts to the range of approximately 5–17 volts.

* * * * *